United States Patent
Neeman et al.

(10) Patent No.: US 8,627,022 B2
(45) Date of Patent: Jan. 7, 2014

(54) CONTENTION FREE PARALLEL ACCESS SYSTEM AND A METHOD FOR CONTENTION FREE PARALLEL ACCESS TO A GROUP OF MEMORY BANKS

(75) Inventors: Yuval Neeman, Ashquelon (IL); Ron Bercovich, Kfar-Saba (IL); Guy Drory, Givataim (IL); Dror Gilad, Kfar Aza"r (IL); Aviel Livay, Holon (IL); Yonatan Naor, Herzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 837 days.

(21) Appl. No.: 12/812,032

(22) PCT Filed: Jan. 21, 2008

(86) PCT No.: PCT/IB2008/050206
§ 371 (c)(1),
(2), (4) Date: Jul. 8, 2010

(87) PCT Pub. No.: WO2009/093099
PCT Pub. Date: Jul. 30, 2009

(65) Prior Publication Data
US 2010/0287343 A1 Nov. 11, 2010

(51) Int. Cl.
*G06F 12/00* (2006.01)
(52) U.S. Cl.
USPC ............... 711/157; 711/5; 711/105; 711/151; 365/230.03; 365/230.04
(58) Field of Classification Search
USPC ................. 711/157, 5, 105, 151; 365/230.03, 365/230.04
See application file for complete search history.

(56) References Cited

U.S. PATENT DOCUMENTS

| | | | |
|---|---|---|---|
| 4,918,587 A * | 4/1990 | Pechter et al. | 711/218 |
| 5,453,957 A * | 9/1995 | Norris et al. | 365/230.04 |
| 5,787,047 A * | 7/1998 | Norris et al. | 365/230.04 |

(Continued)

OTHER PUBLICATIONS

Tarable A et al: "Mapping Interleaving Laws to Parallel Turbo Decoder Architectures" IEEE Communications Letters, IEEE Service Center, Piscataway, NJ, US, vol. 8, No. 3, Mar. 1, 2004, pp. 1-4.

(Continued)

*Primary Examiner* — Stephen Elmore (57) ABSTRACT

A parallel access system including: a group of processing entities that comprises N processing entities; wherein N is a positive integer that exceeds one; a group of memory banks that stores K information elements; wherein the group of memory banks comprises N pairs of single access memory banks; each pair of memory banks comprises an even memory bank and an odd memory bank; wherein each pair of memory banks stores sub-set of K/N information elements; wherein an even memory bank of each pair of memory banks stores even address information elements of a certain sub-set of K/N information elements and an odd memory bank of each pair of memory banks stores odd address information elements of the certain sub-set of K/N information elements; wherein K/N is an even positive integer; and a non-blocking interconnect, coupled to the group of processing entities and to the group of memory banks; wherein during each fetch cycle each processing entity of the group of processing entities fetches a first information element from an odd memory unit of a pair of memory banks and fetches a second information element from an even memory unit of the pair of memory banks; wherein the first and second information elements are two consecutive interleaved address information elements.

17 Claims, 7 Drawing Sheets

(56) References Cited

U.S. PATENT DOCUMENTS 5,831,926 A * 11/1998 Norris et al. ............. 365/230.04
5,848,428 A * 12/1998 Collins ......................... 711/127
6,076,136 A *  6/2000 Burroughs et al. ............... 711/5
6,954,832 B2  10/2005 Suzuki et al.

OTHER PUBLICATIONS

Wehn N: "SoC-Network for Interleaving in Wireless Communications" Internet Citation, Online, XP002464594, Retrieved from the Internet: URL:http://tima.imag.fr/MPSOC/2003/slides/MPSOC03_presentation_wehn.pdf> Retrieved on Jan. 14, 2008, pp. 1-13.

Motorola: "A Contention-Free Interleaver Design for LTE Turbo Codes" Internet Citation, Online, Nov. 10, 2006, XP002475771, Retrieved from the internet: URL:http://www.3gpp.org/ftp/tsg_ran/WG1_RL1/TSGR1_47/Docs/> Retrieved on Apr. 9, 2008, pp. 1-9.

International Search Report and Written Opinion correlating to PCT/IB2008/050206 dated Jul. 4, 2008, pp. 1-12.

* cited by examiner

Fig. 2

| P0 | | P1 | | P2 | | P3 | | 110(0) 0-4 | 110(1) 5-9 | 110(2) 10-14 | 110(3) 15-19 | 110(4) 20-24 | 110(5) 25-29 | 110(6) 30-34 | 110(7) 35-39 |
|---|---|---|---|---|---|---|---|---|---|---|---|---|---|---|---|
| 0 |  | 13 | 30 | 3 | 20 | 33 | 10 | 23 | 1 | 0 | 1 | 0 | 1 | 0 | 1 | 0 |
| 6 |  | 19 | 36 | 9 | 26 | 39 | 16 | 23 | 1 | 0 | 1 | 0 | 1 | 0 | 1 | 0 |
|  |  |  |  |  |  |  | 16 | 29 | 0 | 1 | 0 | 1 | 0 | 1 | 0 | 1 |
| 12 | 25 | 2 | 15 | 32 | 5 | 22 | 29 | 0 | 1 | 0 | 1 | 0 | 1 | 0 | 1 |
| 18 | 31 | 8 | 21 | 38 | 11 | 28 | 35 | 1 | 1 | 1 | 1 | 1 | 1 | 1 | 1 |
| 24 | 37 | 14 | 27 | 4 | 17 | 34 | 1 | 1 | 1 | 1 | 1 | 1 | 1 | 1 | 1 |
|  |  |  |  |  |  |  | 7 | 1 | 1 | 1 | 1 | 1 | 1 | 1 | 1 |

| P0 | P1 | P2 | P3 | 212(0) 0-9 Even | 214(0) 0-9 Odd | 212(1) 10-19 even | 214(1) 10-19 odd | 212(2) 20-29 even | 214(2) 20-29 odd | 212(2) 30-39 even | 210(2) 30-39 odd |
|---|---|---|---|---|---|---|---|---|---|---|---|
| | | | | 210(0) | | 210(1) | | 210(2) | | 210(2) | |
| 0 | 13 | 30 | 3 | 20 | 33 | 10 | 23 | 1 | | | | | | |
| 6 | 19 | 36 | 9 | 26 | 39 | 16 | 29 | 1 | 1 | 1 | 1 | 1 | 1 | 1 |
| 12 | 25 | 2 | 15 | 32 | 5 | 22 | 35 | 1 | 1 | 1 | 1 | 1 | 1 | 1 |
| 18 | 31 | 8 | 21 | 38 | 11 | 28 | 1 | 1 | 1 | 1 | 1 | 1 | 1 | 1 |
| 24 | 37 | 14 | 27 | 4 | 17 | 34 | 7 | 1 | 1 | 1 | 1 | 1 | 1 | 1 |

Fig. 6

CONTENTION FREE PARALLEL ACCESS SYSTEM AND A METHOD FOR CONTENTION FREE PARALLEL ACCESS TO A GROUP OF MEMORY BANKS

FIELD OF THE INVENTION

This disclosure relates generally to turbo decoders, and more specifically, to parallel contention free interleaved access to memory.

BACKGROUND OF THE INVENTION

Wireless communication systems are widely deployed to provide various types of communications such as voice and data. One such system is wide band code division multiple access (WCDMA), which has been adopted in various competing wireless communication standards, e.g. third generation partnership project 3GPP, 3GPP project 2 (3GPP2) and long term evolution 3GPP (LTE 3GPP).

To overcome data corruption that can occur during RF transmission, the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment. A turbo encoder typically includes a pair of convolutional encoders, one of which receives information bits (i.e. systematic bits) while the other convolutional encoder receives interleaved information bits. The information bits are shuffled (interleaved) in accordance with a specified interleaving scheme. The pair of convolutional encoders output two sequences of parity bits that are modulated and transmitted to a receiver. The systematic bits are also modulated and transmitted to the receiver.

Figure 1:
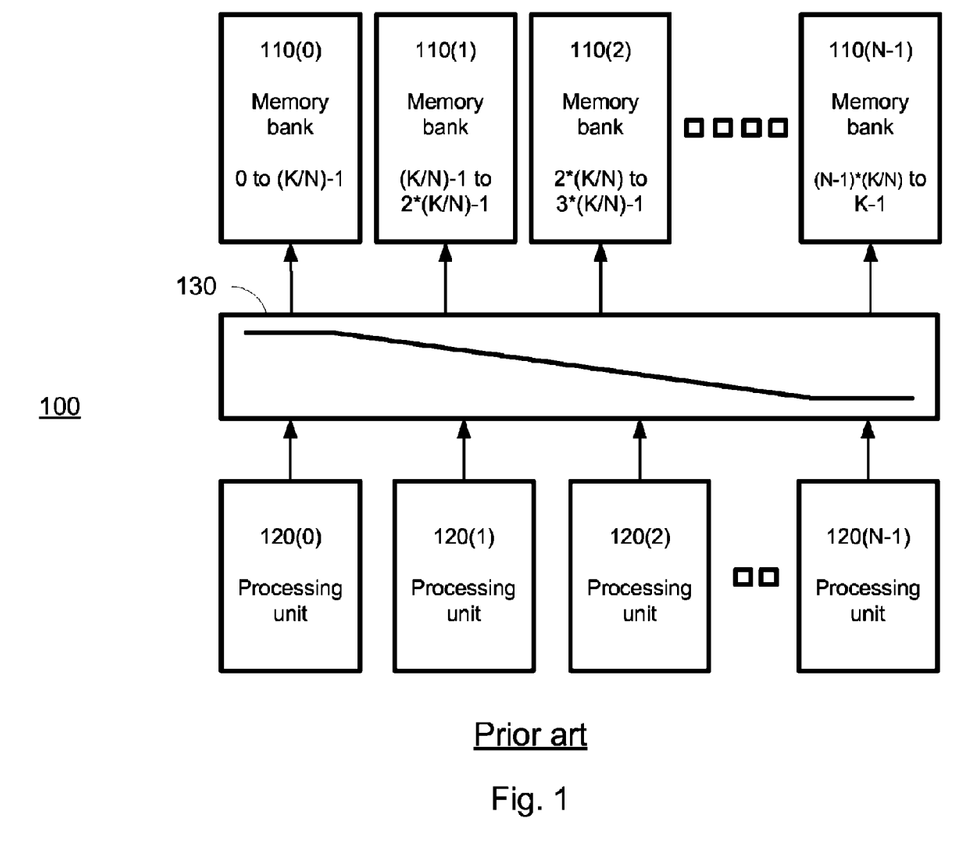
FIG. 1 illustrates a prior art turbo decoder.

FIG. 1 illustrates prior art turbo decoder 100. Turbo decoding is performed by an iterative process in which so called extrinsic information elements are exchanged between sub-blocks (also referred to as a processing units) 120 of turbo decoder 100. Extrinsic information elements are stored in multiple memory banks 110 and form a block of a certain size (K). Memory banks 110 are connected to processing units 120 via interconnect 130. Each processing unit can apply a soft input soft output algorithm. In order to utilize multiple sub-blocks 120 in an efficient manner the processing units 120 should operate in a parallel contention free manner.

Various single access contention free interleavers were developed. A single access contention free interleaver can prevent contentions if each processing unit fetches, during a single fetch cycle, a single extrinsic information unit. 3GPP LTE interleavers applies the following interleaving function: phi(x)=(f1*x+f2*x$^2$)modulo(K), whereas f1 and f2 are set in response to the value of K.

Single access contention free interleavers limit the access of each processing unit to a certain sub-set of the block. Thus, if there are N processing units, each one can access a single K/N sub-set of information elements. During each access.

The throughput of a turbo decoder can be increased by adding more processing units (increasing N). This solution it is costly as it involves adding processing units. In addition, the quality of the turbo decoding process decreases when the size of the K/N sub-set of information elements decreases.

There is a growing need to provide turbo decoders that are characterized by a high parallelism and enhanced performance.

SUMMARY OF THE INVENTION

The present invention provides a method and a system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE DRAWINGS

A system and method are provided. They are characterized by an interleaved contention free access to multiple memory banks during each fetch cycle. High throughput can be achieved by allowing each processing unit to fetch multiple consecutive interleaved address information elements. The fetching of multiple consecutive interleaved address information elements per a fetch cycle enables to utilize fewer processing element, thus exposing each processing element to a larger sub-set of information elements.

It is noted that a system, method or a fetching are referred to as WiMax compliant or 3 compliant if the system fetches information elements according to WiMax standard or LTE 3GP standard respectively, if the method (and especially the fetching operation) is performed according to the WiMax standard or LTE 3GP standard. Conveniently, these standards include at least the LTE 3GP standard and the WiMax standard that are at force at January 2008.

It is noted that the mentioned below systems and methods can operate in any interleaving scheme where multiple consecutive interleaved address information elements of different parity should be fetched substantially simultaneously.

Figure 2:
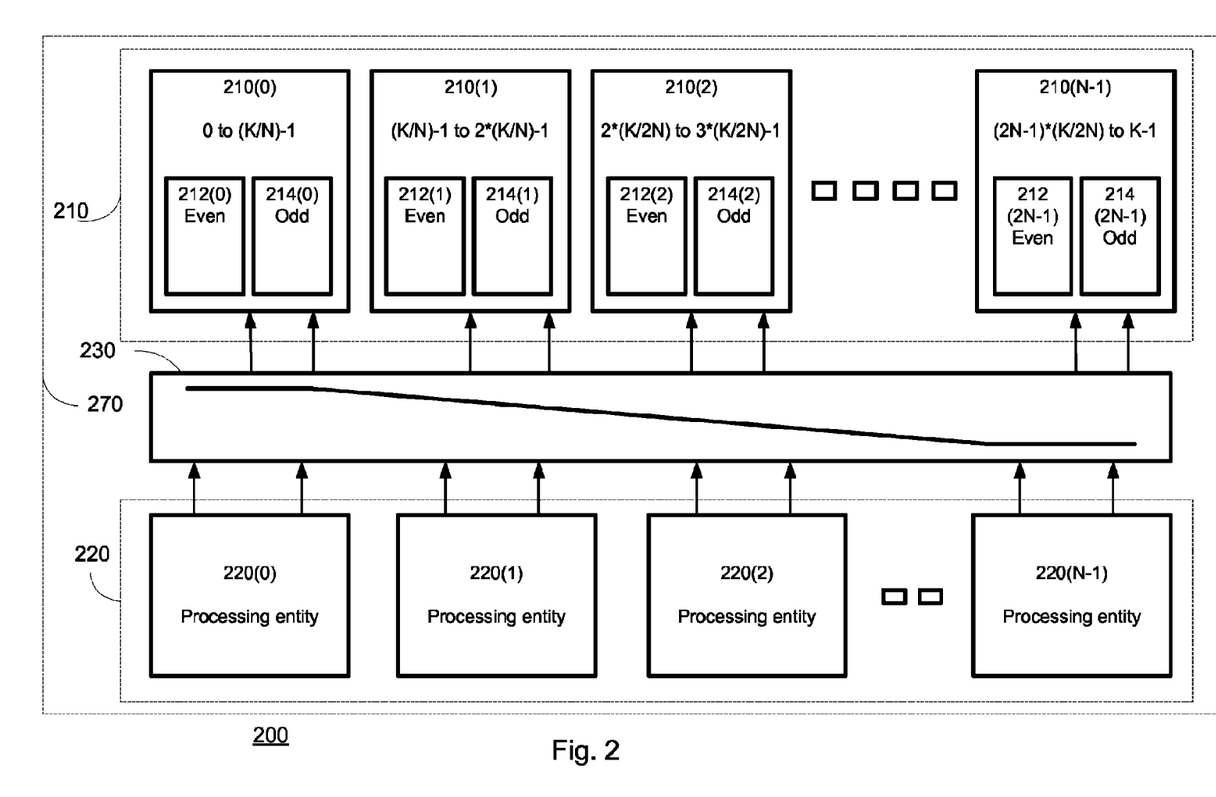
FIG. 2 illustrates an example of a parallel access system.

FIG. 2 illustrates an example of a parallel access system 200. System 200 includes: (a) a group of processing entities that includes N processing entities 220 (denoted 220(0) through 220(N−1)); wherein N is a positive integer; (b) a group of memory banks that stores K information elements and which includes N pairs of single access memory banks (denoted (210(0) through 210(N−1)). Each pair of memory banks 210 includes an even memory bank 212 and an odd memory bank 214. Each pair of memory banks 210 stores sub-set of K/N information elements An even memory bank 212 of each pair of memory banks 210 stores even address information elements of a certain sub-set of K/N information elements and an odd memory bank 214 of each pair of memory banks 210 stores odd address information elements of the certain sub-set of K/N information elements. K/N is an even positive integer. A non-blocking interconnect 230 is connected to the group of processing entities and to the group of memory banks.

During a fetch cycle, each processing entity 220 of the group of processing entities fetches a first information element from an odd memory unit 214 of a pair of memory banks 210 and fetches a second information element from an even memory unit 212 of the pair of memory banks 210; wherein the first and second information elements are two consecutive interleaved address information elements.

It is noted that, conveniently, the group of memory banks and the group of processing entities belong to a turbo decoder. In an example, the turbo decoder is a radix four turbo decoder.

In an example, the group of processing entities applies a third generation partnership project long term evolution quadratic permutation polynomial interleaving function.

Conveniently, the systems and methods provide contention free system for radix-4/radix-8 turbo decoder for any K if K/N is a positive even integer and if K is specified in LTE 3GPP or WiMax standards and for any N processing elements accessing 2*N memory banks given a contention free system for radix-2/radix-4 turbo decoder and for any K if K/N is a positive even integer and if K is specified in specified in LTE 3GPP or WiMax with N processing elements accessing N memory banks.

Conveniently, the systems and methods can guarantee that contention free straight forward division of a LTE 3GPP compliant interleaver for N processing elements. The systems and methods can enable using a contention free WiMax radix-2 interleaver for performing contention free WiMax radix-4 interleaver for various K and N values.

Figure 3A:
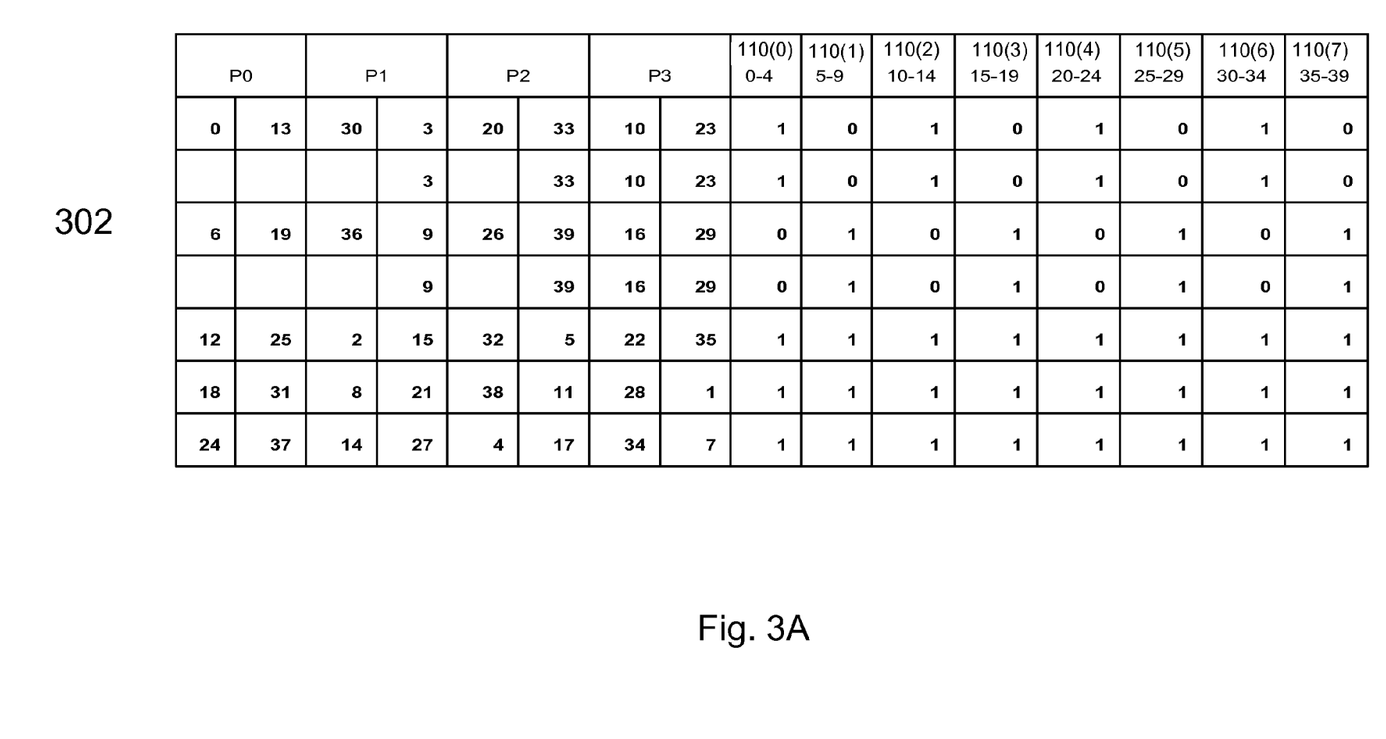
FIG. 3A illustrates an example of accessing of processing entities to memory banks.

FIG. 3A illustrate accessing of processing entities to memory banks, wherein each processing entity (denoted P0 through P3) accesses two consecutive interleaved address information elements in every cycle (the interleaved address information elements access by each processing unit P0 through P3 are listed in two columns below the correlating processing entity column caption). It is assumed that the access are according to LTE 3GPP with K=40, F1=3 and F2=10. Thus the following series of interleaved numbers are provided: 0, 13, 6, 19, 12, 25, 18, 31, 24, 37, 30, 3, 36, 9, 2, 15, 8, 21, 14, 27, 20, 33, 26, 39, 32, 5, 38, 11, 4, 17, 10, 23, 16, 29, 22, 35, 28, 1, 34, and 7.

Table 302 illustrates accessing of processing entities P0 through P3 to a group of memory banks that includes eight memory banks 110(0) through 110(7), wherein each of memory banks 110(0) through 110(7) includes 5 information elements, to a total of K=40 information elements in the entire group of memory banks. Each memory bank 110(0) through 110(7) includes five consecutive (non-interleaved) addresses (e.g. memory bank 110(0) includes addresses 0 through 4; memory bank 110(1) includes addresses 5 through 9, and so forth). It is noted that the division of the information elements into memory banks 110(0) through 110(7) is not implemented according to the teaching of the invention, and is only offered by way of comparison. Each row of the table illustrates a single cycle.

It is noted that the memory allocation illustrated by table 302 was designed to provide a "contention free" interleaving scheme for eight processing elements working in radix-2 (during which each processing element fetches one information element per cycle). Table 302 illustrates that this memory allocation does not provide a "contention free" interleaving scheme for four processing elements that working in radix-4 (during which each processing element fetches two information elements per cycle).

Figure 3B:
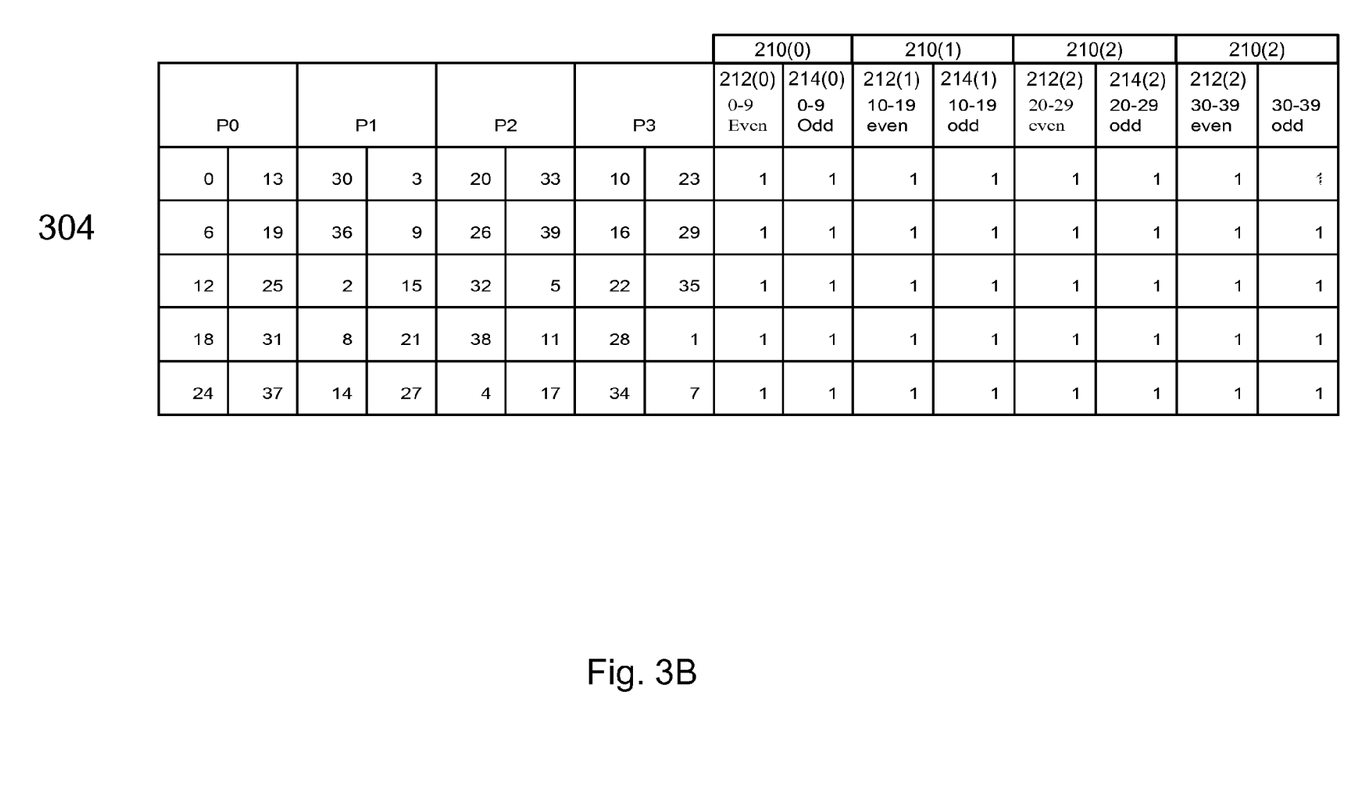
FIG. 3B illustrates an example of accessing of processing entities to memory banks.

FIG. 3B illustrate accessing of processing entities to memory banks, in an example, wherein each processing entity (denoted P0 through P3) accesses two consecutive interleaved address information elements in every cycle (the interleaved address information elements access by each processing unit P0 through P3 are listed in two columns below the correlating processing entity column caption). It is assumed that the access are according to LTE 3GPP with K=40, F1=3 and F2=10. Thus the following series of interleaved numbers are provided: 0, 13, 6, 19, 12, 25, 18, 31, 24, 37, 30, 3, 36, 9, 2, 15, 8, 21, 14, 27, 20, 33, 26, 39, 32, 5, 38, 11, 4, 17, 10, 23, 16, 29, 22, 35, 28, 1, 34, and 7.

Table 304 illustrates accessing of processing entities P0 through P3 to a group of memory banks that includes eight memory banks, 212(0) through 212(3) and 214(0) through 214(3), wherein the memory banks are stored in pairs of single access memory banks 210(0) through 210(3); wherein each pair of memory banks 210 includes an even memory bank 212 and an odd memory bank 214 (e.g. pair of memory banks 210(3) includes even memory bank 212(3) and odd memory bank 214(3)); wherein each pair of memory banks 210 stores sub-set of K/N (i.e. 40 divided by 4, that is 10) information elements; wherein an even memory bank 212 of each pair of memory banks 210 stores even address information elements of a certain sub-set of K/N information elements and an odd memory bank 214 of each pair of memory banks 210 stores odd address information elements of the certain sub-set of K/N information elements. For example, even memory bank 212(2) of pair of memory banks 210(1) stores even address information elements of a sub-set 20-29 of 10 information elements (i.e. the five information elements 20, 22, 24, 26 and 28) and odd memory bank 214(2) of pair of memory banks 210(2) stores odd address information elements of the sub-set 20-29 (i.e. the five information elements 21, 23, 25, 27 and 29). Each row of the table illustrates a single cycle.

Referring now to both FIGS. 3A and 3B, in both of the configurations represented by tables 302 and 304, for processing entities P0 through P3 access information elements grouped into eight single access memory banks. The access sequence that is indicated for each processing entity P0 through P3 for two consecutive interleaved address information elements in every cycle (wherein the interleaved address information elements access by each processing unit P0 through P3 are listed in two columns below the correlating processing entity column caption) is a standard access sequence that is implemented in turbo decoding for K=40 and where eight single access memory banks are present. In both of the tables 302 and 304, in the column corresponding to each of the memory banks, the digit 1 denotes that the memory bank was accessed during the cycle represented by the corresponding row, and the digit 0 represents that the memory bank was not accessed.

It is noted that conveniently, consecutive interleaved address information elements are generated by applying an interleaving function on two consecutive (non-interleaved) addresses. A set of K non-interleaved addresses is divided to N sub-sets of equal length (K/N). Each processing unit 220 is associated with a unique sub-set of K/N non-interleaved addresses. The different processing units 220 scan (during multiple fetch cycles) their unique sub-sets of K/N non-interleaved addresses in a sequential manner and after applying the interleaving function access different memory banks. Conveniently, during each fetch cycle each processing unit 220 fetches two consecutive interleaved address information elements.

The addresses of consecutive interleaved address information elements accessed by each processing unit 220 are determined according to an interleaved address determination algorithm. In an example (such as the one illustrated by table 304), N equals four, K equals forty; and wherein during a j'th fetch cycle a first processing entity fetches a modulo40[(j−1)*6]'th information element and a modulo40[13+(j−1)*6]'th information element; a second processing entity fetches a modulo40[30+(j−1)*6]'th information element and a modulo40[3+(j−1)*6]'th information element; a third processing entity fetches a modulo40[20+(j−1)*6]'th information element and a modulo40[33+(j−1)*6]'th information element; and a fourth processing entity fetches a modulo40 [10+(j−1)*6]'th information element and a modulo40[23+(j−1)*6]'th information element.

Taking into consideration, by way of example, the first cycle (represented by the first row of data in each of tables 302 and 304), wherein processing entity P0 requires access to information elements 0 and 13, processing entity P1 requires access to information elements 30 and 3, processing entity P2 requires access to information elements 20 and 33, and processing entity P3 requires access to information elements 10 and 23.

According to the teaching of the invention, wherein the memory banks are divided into pairs of odd and even memory banks, each single access memory bank (212 and 214) is accessed once during each cycle. In comparison, according to a standard straight forward method (represented by table 302) in which each memory bank 110 include five consecutive information elements, each of memory banks 110(0), 110(2), 110(4) and 110(6) includes two information elements that need to be read during the first cycle (represented by the first row), and therefore, the first cycle required two reading cycles, wherein in the second reading cycle (represented by the second row of table 302) each of memory banks 110(0), 110(2), 110(4) and 110(6) is accessed again, to retrieve information from information elements 3, 33, 10 and 23. Similarly, for the second access sequence 6, 19, 36, 9, 26, 39, 16, and 29 (indicated in the third row—corresponding to the third reading cycle—of table 302, and in the second row—i.e. reading cycle—of table 304), again 4 single access memory banks 110 need to be accessed twice, instead of a single access to each even memory bank 212 and a single access to each odd memory bank 214 according to the teaching of the invention, as illustrated in table 304.

It is therefore clear to a person who is skilled in the art that implementing the memory banks according to the teaching of the invention requires less reading cycles of the single access memory banks, and thus expedites the process of turbo decoding.

In an example (such as the one illustrated by table 304), parallel access system 200 is such wherein K equals forty; and wherein the number or processing entities equals four. In an example (such as the one illustrated by table 304), K/N exceeds seven.

Figure 4:
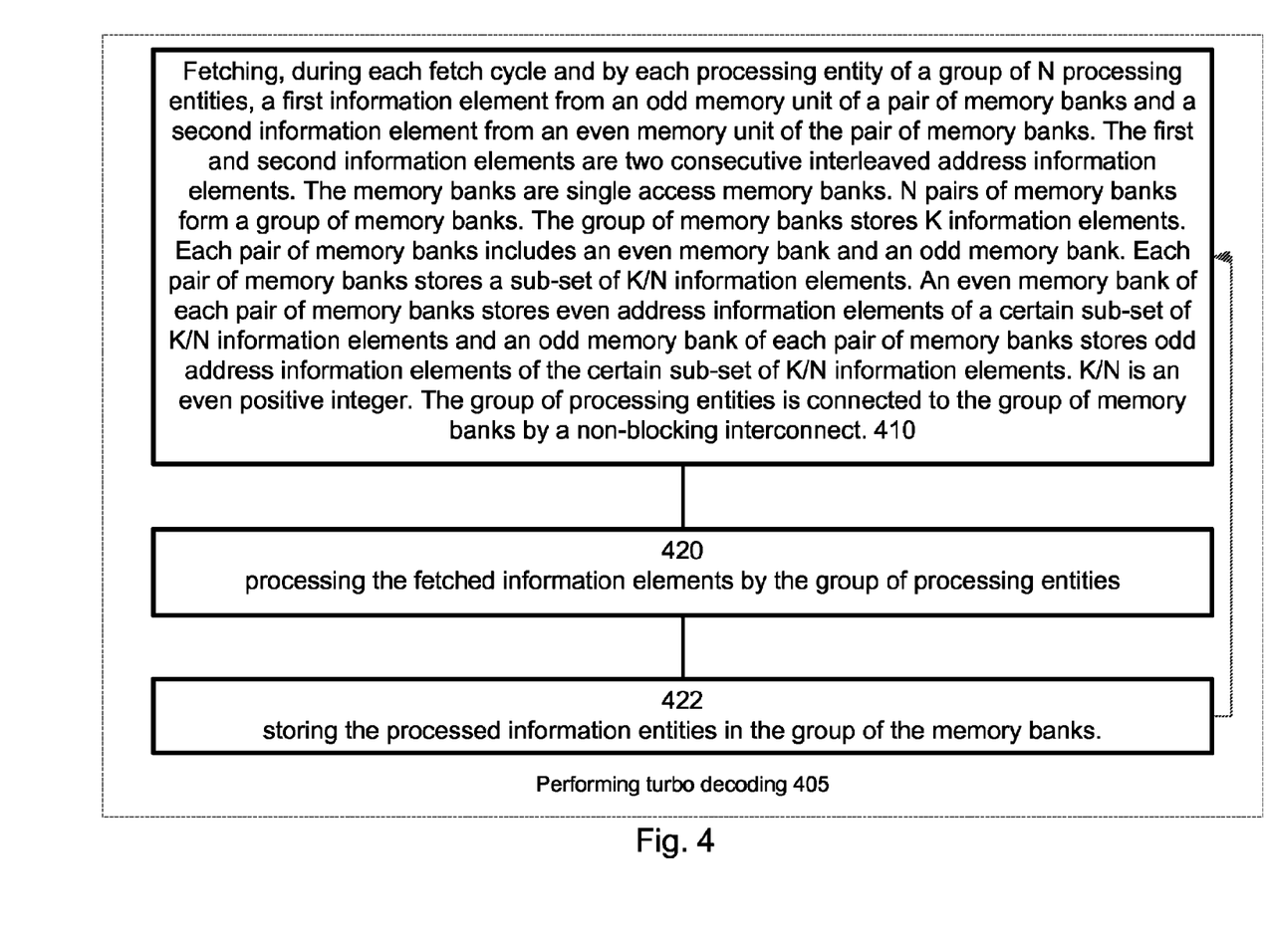
FIG. 4 illustrates an example of a method for parallel access to a group of memory banks.

FIG. 4 illustrates an example of a method 400 for parallel access to a group of memory banks. It is clear to a person who is skilled in the art that method 500 relates to system 200, and that different embodiments of method 500 could be carried out by different embodiments of system 200. Thus, the description of method 500 benefits from the description of system 200, and vice versa.

Method 400 starts by stage 410 of fetching, during each fetch cycle and by each processing entity of a group of N processing entities, a first information element from an odd memory unit of a pair of memory banks and a second information element from an even memory unit of the pair of memory banks. The first and second information elements are two consecutive interleaved address information elements.

The memory banks are single access memory banks. N pairs of memory banks form a group of memory banks. The group of memory banks stores K information elements. Each pair of memory banks includes an even memory bank and an odd memory bank. Each pair of memory banks stores a subset of K/N information elements. An even memory bank of each pair of memory banks stores even address information elements of a certain sub-set of K/N information elements and an odd memory bank of each pair of memory banks stores odd address information elements of the certain sub-set of K/N information elements. K/N is an even positive integer. The group of processing entities is connected to the group of memory banks by a non-blocking interconnect.

In an example, stage 410 of fetching is followed by stage 420 processing the fetched information elements by the group of processing entities. Stage 420 is followed by stage 422 of storing the processed information entities in the group of the memory banks.

In an example, the stages of fetching and processing are repeated during a turbo decoding process. In an example, method 400 includes performing (405) turbo decoding. In an example, the turbo decoding is carried out by a turbo decoder that is a radix four turbo decoder. In an example, the turbo decoding is carried out by a turbo decoder that is a WiMax radix-8 turbo decoder.

In an example, K is forty and the number or processing entities is four. In an example, N equals four, K equals forty; and wherein the fetching includes fetching, during a j'th fetch cycle, by a first processing entity a modulo40[(j−1)*6]'th information element and a modulo40[13+(j−1)*6]'th information element; fetching, during the j'th fetch cycle, by a second processing entity, a modulo40[30+(j−1)*6]'th information element and a modulo40[3+(j−1)*6]'th information element; fetching, during the j'th fetch cycle, by a third processing entity a modulo40[20+(j−1)*6]'th information element and a modulo40[33+(j−1)*6]'th information element; and fetching, during the j'th fetch cycle, by a fourth processing entity a modulo40[10+(j−1)*6]'th information element and a modulo40[23+(j−1)*6]'th information element.

In an example, the fetching comprises applying a third generation partnership project long term evolution quadratic permutation polynomial interleaving function.

Figure 5:
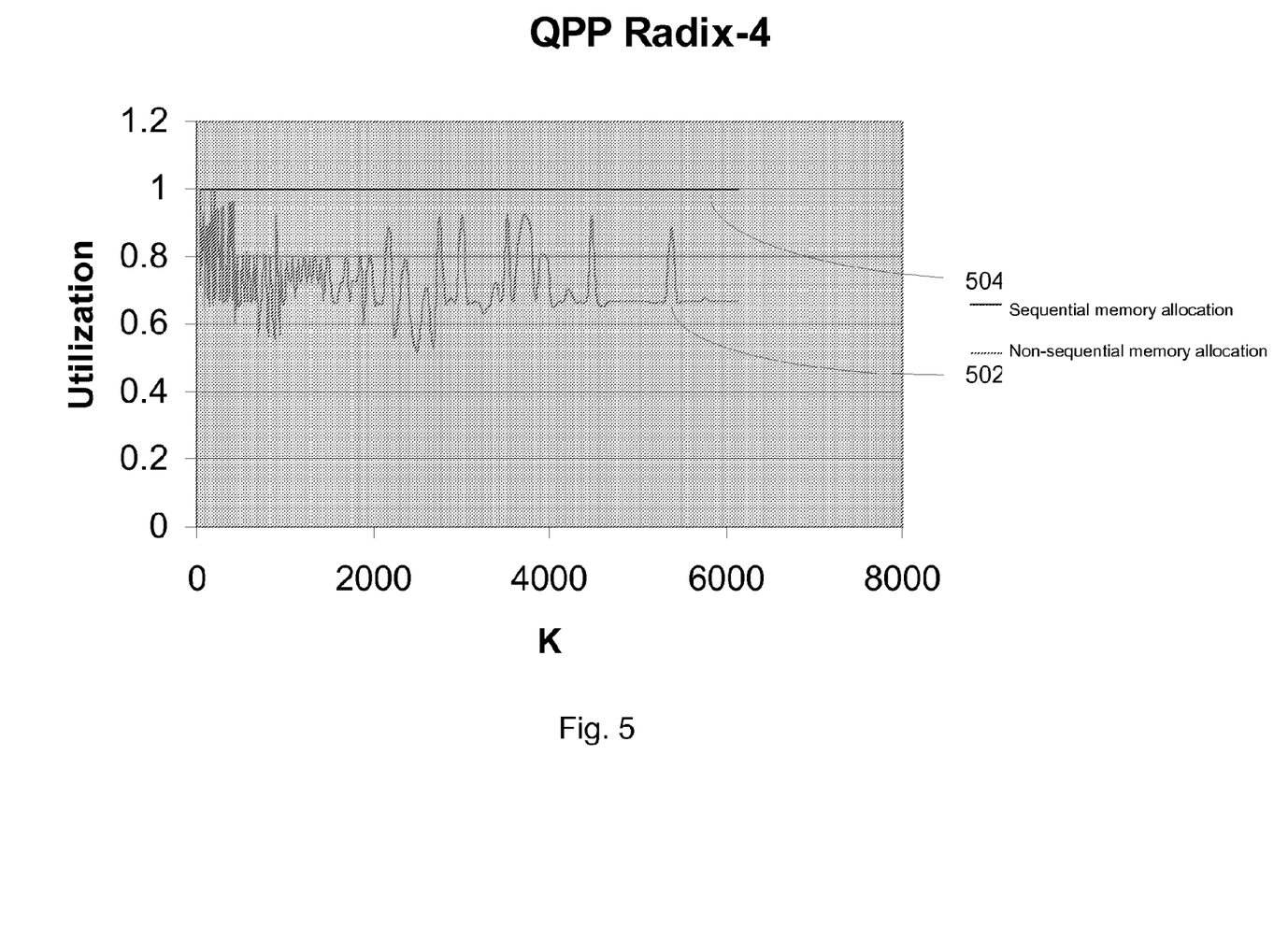
FIG. 5 illustrates an example of a utilization of a turbo decoder when applying a quadratic permutation polynomial (QPP) radix-4 interleaving scheme.

FIG. 5 illustrates an example of a utilization of a turbo decoder when applying a quadratic permutation polynomial (QPP) radix-4 interleaving scheme. This QPP interleaving scheme is defined in LTE 3GPP standard. FIG. 5 illustrates memory utilizations measured for QPP interleaving scheme using ordinary division (denoted "sequential memory allocation") of address space to 8 single access memory banks (illustrated by line 502) and with division of address space to 4 pair of even-odd banks (denoted "non-sequential memory allocation"), in accordance with the teaching of the invention (illustrated by line 504). The memory utilization is illustrated for different number K of memory entities, wherein K is a multiple of 8.

The memory utilization (i.e. the ratio between the number of access cycle to the number of reading cycles needed to complete the accesses) according to the teaching of the invention is 1, regardless of the number of memory entities implemented. However, using the ordinary division (also described in relation to table 302 of FIG. 3), the memory utilization is lower than 1 for most of the variation of K, usually in the range of approx. 0.6 and 0.8.

It is therefore clear to any person who is skilled in the art that the implementation of the systems and/or of the methods herein disclosed offers improvement of approximately 25% to 60% for most of the variation of K.

Figure 6:
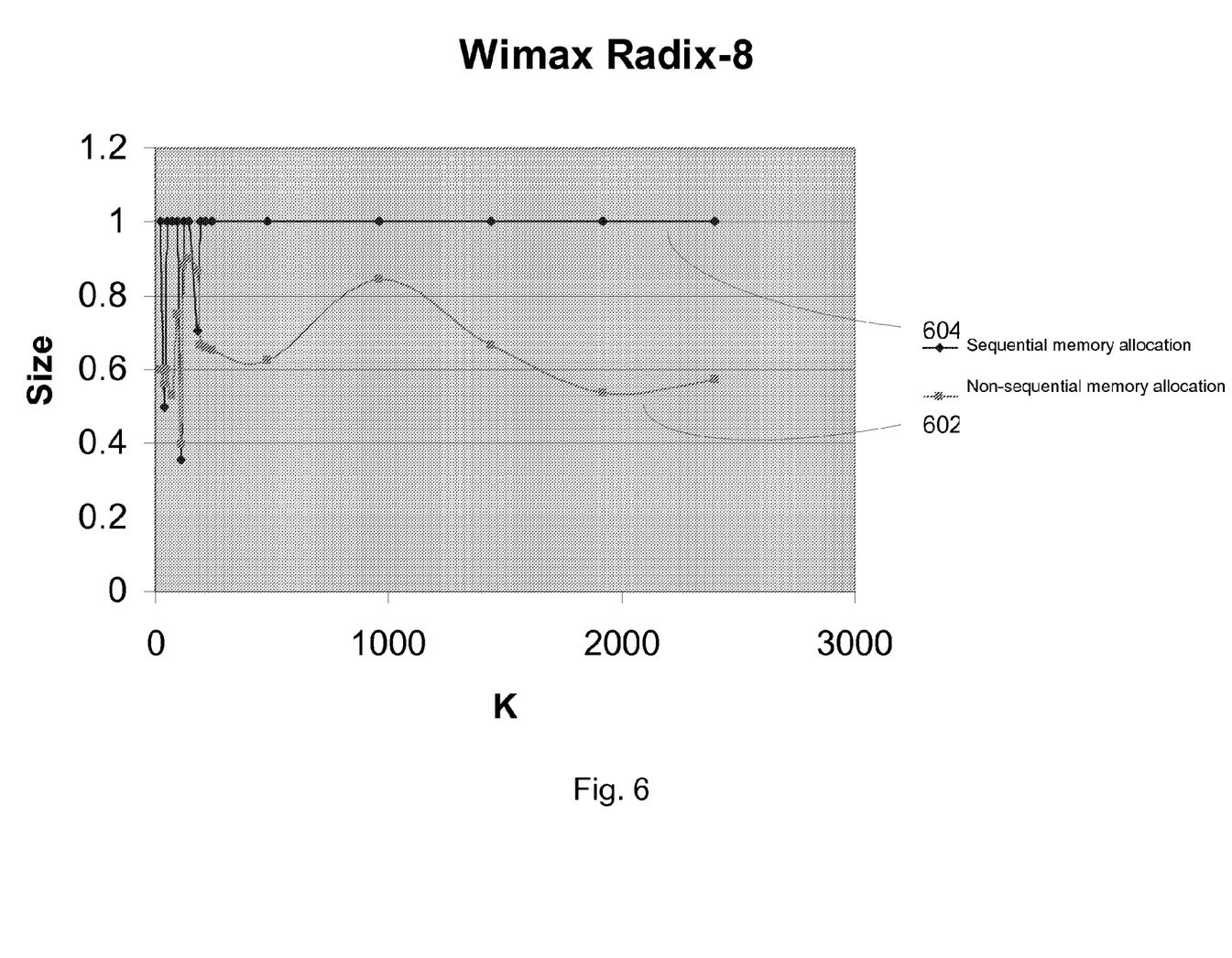
FIG. 6 illustrates an example of a utilization of a turbo decoder when applying a Wimax radix-8 interleaving scheme.

FIG. 6 illustrates an example of a utilization of a turbo decoder when applying a Wimax radix-8 interleaving scheme. Illustrated in FIG. 6 are memory utilizations measured for Wimax or LTE 3GPP interleaving scheme using ordinary division (denoted "sequential memory allocation") of address space to 16 single access memory banks (illustrated by line 602) with a division (denoted "non-sequential memory allocation") of address space to 8 pair of even-odd banks, in accordance with the teaching of the invention (illustrated by line 604). The memory utilization is illustrated for different number K of memory entities, wherein K is a multiple of 16. It is noted that K equal a half of either one of the block sizes specified in WiMax standard. For example, K can equal either one of the following values 24, 36, 48, 72, 96, 108, 120, 144, 180, 192, 216, 240, 480, 960, 1440, 1920, and 2400.

The memory utilization (i.e. the ratio between the number of access cycle to the number of reading cycles needed to complete the accesses) according to the teaching of the invention is 1, regardless of the number of memory entities implemented. However, using the ordinary division (also described in relation to table 302 of FIG. 3), the memory utilization is lower than 1 for most of the variation of K, usually in the range of approx. 0.6 and 0.8

It is therefore clear to any person who is skilled in the art that the implementation of the systems and/or of the methods herein disclosed offers improvement of approximately 25% to 60% for most of the variation of K.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device.

However, other modifications, variations and alternatives are also possible. The specifications and drawings are, accordingly, to be regarded in an illustrative rather than in a restrictive sense.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

What is claimed is:

1. A parallel access system comprising:
   a group of processing entities that comprises N processing entities; wherein N is a positive integer
   a group of memory banks that stores K information elements; wherein the group of memory banks comprises N pairs of single access memory banks; each pair of memory banks comprises an even memory bank and an odd memory bank; wherein each pair of memory banks stores sub-set of K/N information elements; wherein an even memory bank of each pair of memory banks stores even address information elements of a certain sub-set of K/N information elements and an odd memory bank of each pair of memory banks stores odd address information elements of the certain sub-set of K/N information elements; wherein K/N is an even positive integer;
   wherein during each fetch cycle each processing entity of the group of processing entities fetches a first information element from an odd memory unit of a pair of memory banks and fetches a second information element from an even memory unit of the pair of memory banks; wherein the first and second information elements are two consecutive interleaved address information elements.

2. The parallel access system according to claim 1 wherein the group of memory banks and the group of processing entities belong to a turbo decoder.

3. The parallel access system according to claim 1 wherein the number of processing entities equals four and wherein K equals forty.

4. The parallel access system according to claim 1 wherein the system is LTE 3GP compliant and wherein K is selected from a group consisting of 40, 48, 56, 64, 72, 80, 88, 96, 104, 112, 120, 128, 136, 144, 152, 160, 168, 176, 184, 192, 200, 208, 216, 224, 232, 240, 248, 256, 264, 272, 280, 288, 296, 304, 312, 320, 328, 336, 344, 352, 360, 368, 376, 384, 392, 400, 408, 416, 424, 432, 440, 448, 456, 464, 472, 480, 488, 496, 504, 512, 528, 544, 560, 576, 592, 608, 624, 640, 656, 672, 688, 704, 720, 736, 752, 768, 784, 800, 816, 832, 848, 864, 880, 896, 912, 928, 944, 960, 976, 992, 1008, 1024, 1056, 1088, 1120, 1152, 1184, 1216, 1248, 1280, 1312, 1344, 1376, 1408, 1440, 1472, 1504, 1536, 1568, 1600, 1632, 1664, 1696, 1728, 1760, 1792, 1824, 1856, 1888, 1920, 1952, 1984, 2016, 2048, 2112, 2176, 2240, 2304, 2368, 2432, 2496, 2560, 2624, 2688, 2752, 2816, 2880, 2944, 3008, 3072, 3136, 3200, 3264, 3328, 3392, 3456, 3520, 3584, 3648, 3712, 3776, 3840, 3904, 3968, 4032, 4096, 4160, 4224, 4288, 4352, 4416, 4480, 4544, 4608, 4672, 4736, 4800, 4864, 4928, 4992, 5056, 5120, 5184, 5248, 5312, 5376, 5440, 5504, 5568, 5632, 5696, 5760, 5824, 5888, 5952, 6016, 6080 and 6144.

5. The parallel access system according to claim 1 wherein the system is WiMax compliant and wherein K is selected from a group consisting of 24, 36, 48, 72, 96, 108, 120, 144, 180, 192, 216, 240, 480, 960, 1440, 1920 and 2400.

6. The parallel access system according to claim 1 wherein K/N exceeds seven.

7. The parallel access system according to claim 1 wherein N equals four, K equals forty; and wherein during a j'th fetch cycle a first processing entity fetches a modulo40[(j−1)*6]'th information element and a modulo40[13+(j−1)*6]'th information element; a second processing entity fetches a modulo40[30+(j−1)*6]'th information element and a modulo40[3+(j−1)*6]'th information element; a third processing entity fetches a modulo40[20+(j−1)*6]'th information element and a modulo40[33+(j−1)*6]'th information element; and a fourth processing entity fetches a modulo40 [10+(j−1)*6]'th information element and a modulo40[23+(j−1)*6]'th information element.

8. The parallel access system according to claim 1 wherein the group of processing entities apply a third generation partnership project long term evolution quadratic permutation polynomial interleaving function.

9. A method for parallel access to a group of memory banks, the method comprises:
   processing fetched information elements by the group of processing entities;
   fetching, during each fetch cycle and by each processing entity of a group of N processing entities, a first information element from an odd memory unit of a pair of memory banks and a second information element from an even memory unit of the pair of memory banks; wherein the first and second information elements are two consecutive interleaved address information elements; wherein the memory banks are single access memory banks; wherein N pairs of memory banks form a group of memory banks; wherein the group of memory banks that stores K information elements; wherein each pair of memory banks comprises an even memory bank and an odd memory bank; wherein each pair of memory banks stores a sub-set of K/N information elements; wherein an even memory bank of each pair of memory banks stores even address information elements of a certain sub-set of K/N information elements and an odd memory bank of each pair of memory banks stores odd address information elements of the certain sub-set of K/N information elements; wherein K/N is an even positive integer; wherein the group of processing entities is coupled to the group of memory banks by a non-blocking interconnect.

10. The method according to claim 9 wherein the processing is followed by storing the processed information entities in the group of the memory banks.

11. The method according to claim 9 wherein the fetching is followed by processing the fetched information elements by the group of processing entities and storing the processed information entities in the group of the memory banks; wherein the fetching and processing are repeated during a turbo decoding process.

12. The method according to claim 9 wherein K equals forty; and wherein the number or processing entities equals four.

13. The method according to claim 9 wherein the fetching is LTE 3GP compliant and wherein K is selected from a group consisting of 40, 48, 56, 64, 72, 80, 88, 96, 104, 112, 120, 128, 136, 144, 152, 160, 168, 176, 184, 192, 200, 208, 216, 224, 232, 240, 248, 256, 264, 272, 280, 288, 296, 304, 312, 320, 328, 336, 344, 352, 360, 368, 376, 384, 392, 400, 408, 416, 424, 432, 440, 448, 456, 464, 472, 480, 488, 496, 504, 512, 528, 544, 560, 576, 592, 608, 624, 640, 656, 672, 688, 704, 720, 736, 752, 768, 784, 800, 816, 832, 848, 864, 880, 896, 912, 928, 944, 960, 976, 992, 1008, 1024, 1056, 1088, 1120, 1152, 1184, 1216, 1248, 1280, 1312, 1344, 1376, 1408, 1440, 1472, 1504, 1536, 1568, 1600, 1632, 1664, 1696, 1728, 1760, 1792, 1824, 1856, 1888, 1920, 1952, 1984, 2016, 2048, 2112, 2176, 2240, 2304, 2368, 2432, 2496, 2560, 2624, 2688, 2752, 2816, 2880, 2944, 3008, 3072, 3136, 3200, 3264, 3328, 3392, 3456, 3520, 3584, 3648, 3712, 3776, 3840, 3904, 3968, 4032, 4096, 4160, 4224, 4288, 4352, 4416, 4480, 4544, 4608, 4672, 4736, 4800, 4864, 4928, 4992, 5056, 5120, 5184, 5248, 5312, 5376, 5440, 5504, 5568, 5632, 5696, 5760, 5824, 5888, 5952, 6016, 6080 and 6144.

14. The method according to claim 9 wherein the fetching is WiMax compliant and wherein K is selected from a group consisting of 24, 36, 48, 72, 96, 108, 120, 144, 180, 192, 216, 240, 480, 960, 1440, 1920 and 2400.

15. The method according to claim 9, comprising performing turbo decoding.

16. The method according to claim 9 wherein N equals four, K equals forty; and wherein the fetching comprises fetching, during a j'th fetch cycle, by a first processing entity a modulo40[(j−1)*6]'th information element and a modulo40[13+(j−1)*6]'th information element; fetching, during the j'th fetch cycle, by a second processing entity, a modulo40[30+(j−1)*6]'th information element and a modulo40[3+(j−1)*6]'th information element; fetching, during the j'th fetch cycle, by a third processing entity a modulo40[20+(j−1)*6]'th information element and a modulo40[33+(j−1)*6]'th information element; and fetching, during the j'th fetch cycle, by a fourth processing entity a modulo40[10+(j−1)*6]'th information element and a modulo40[23+(j−1)*6]'th information element.

17. The method according to claim 9 wherein the fetching comprises applying a third generation partnership project long term evolution quadratic permutation polynomial interleaving function.

* * * * *